(12) United States Patent
White et al.

(10) Patent No.: US 11,605,895 B1
(45) Date of Patent: Mar. 14, 2023

(54) ACTIVE BICONICAL ANTENNA AND RECEIVE ARRAY

(71) Applicant: The Boeing Company, Chicago, IL (US)

(72) Inventors: Carson R. White, Agoura Hills, CA (US); Ignacio Ramos, Santa Monica, CA (US); Hyok J. Song, Oak Park, CA (US); Nathan R. Brooks, Centreville, VA (US); Todd Rork, Boyds, MD (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 17/494,095

(22) Filed: Oct. 5, 2021

(51) Int. Cl.
*H01Q 13/04* (2006.01)
*H01Q 9/28* (2006.01)
(Continued)

(52) U.S. Cl.
CPC ............. *H01Q 13/04* (2013.01); *H01Q 9/28* (2013.01); *H01Q 21/064* (2013.01); *H01Q 1/38* (2013.01)

(58) Field of Classification Search
CPC ......... H01Q 13/04; H01Q 9/28; H01Q 21/064
See application file for complete search history.

(56) References Cited

U.S. PATENT DOCUMENTS

| | | | | |
|---|---|---|---|---|
| 5,260,820 A | * | 11/1993 | Bull | ...... H01Q 3/2676 343/773 |
| 2001/0004249 A1 | * | 6/2001 | Sharp | ...... H01Q 21/064 343/824 |

(Continued)

FOREIGN PATENT DOCUMENTS

| | | |
|---|---|---|
| EP | 1542314 A1 | 6/2005 |
| EP | 2490296 A1 | 8/2012 |
| NO | 20170110 A1 * | 1/2017 ............... H01Q 9/28 |

(Continued)

OTHER PUBLICATIONS

Extended European Search Report (EESR) dated Nov. 25, 2022, in European Patent Application No. 22180074.1 European counterpart of the instant patent application).

*Primary Examiner* — Hoang V Nguyen
(74) *Attorney, Agent, or Firm* — Ostrager Chong Flaherty & Broitman P.C.

(57) ABSTRACT

An active biconical antenna and a receive array comprising a combination of active biconical and Vivaldi antennas. In one configuration, the active biconical antenna includes upper and lower cones. Each cone has a respective truncated apex. First and second feed points are respectively connected to the truncated apexes of the upper and lower cones and to first and second conductors. The active biconical antenna further includes a buffer amplifier having respective input terminals connected to the first and second conductors. The buffer amplifier has an input impedance that is impedance matched to an antenna impedance at and above but not below a frequency $f_c$ and is higher than the antenna impedance at frequencies substantially less than $f_c$. The buffer amplifier also has an output impedance that is impedance matched to a system impedance at frequencies both above and below $f_c$. A length of the first and second conductors is less than a wavelength at the frequency $f_c$.

20 Claims, 16 Drawing Sheets

(51) Int. Cl.
*H01Q 21/06* (2006.01)
*H01Q 1/38* (2006.01)

(56) References Cited

U.S. PATENT DOCUMENTS

2011/0001679 A1  1/2011  Meharry et al.
2020/0099132 A1  3/2020  White et al.
2020/0099143 A1  3/2020  White et al.

FOREIGN PATENT DOCUMENTS

WO          2020244636 A1     12/2020
WO    WO-2020244636 A1 *  12/2020  ............... H01Q 1/36

* cited by examiner

ACTIVE BICONICAL ANTENNA AND RECEIVE ARRAY

BACKGROUND

The technology disclosed herein relates, generally, to receive antennas and, in particular, to biconical and Vivaldi receive antennas.

In the following disclosure, the terms "passive antenna" and "active antenna" are employed. An active antenna includes an integrated low-noise signal amplifier built into the unit. Passive antennas are antennas that do not have an amplification stage. There is no difference between the antenna element of an active or passive antenna of the same type; the only difference is that one has a low-noise amplifier and the other does not. Active antennas can be used for both receiving and transmitting applications. When the antenna is used to receive, the integrated low-noise amplifier boosts the radiofrequency (RF) signals picked up by the antenna to compensate for downstream cable loss, thereby allowing longer remote cable runs. As used herein, the term "buffer amplifier" (a.k.a. "buffer") is an amplifier that provides electrical impedance isolation from one circuit to another for the purpose of mitigating the effects of standing waves that an antenna impedance may produce. In other words, the receiver is buffered from the antenna.

Passive biconical antennas are wideband antennas that use the principle of frequency-independent antennas. This means that since the geometry is specified only by angles, the radiation characteristics are independent of frequency, limited at the low end by the size of the antenna and at the high end by the tolerances of the feed point (at the apex of the antenna). The low-frequency limitation is especially burdensome in the very-high-frequency band, where the size and weight required to achieve high performance is inconsistent with system requirements. A typical passive biconical antenna may receive signals in a frequency range of 1-10 GHz (referred to herein as the "traditional band"). At frequencies of a so-called "extension band" (e.g., 0.1-1 GHz) where the antenna becomes too small, the biconical antenna behaves like an electrically small dipole antenna. The performance is fundamentally limited by the Bode-Fano and Chu limits.

Active dipole antennas, which incorporate a high-impedance buffer amplifier into the feed of the dipole antenna, achieve improved performance in the range of frequencies 0.1-1 GHz, but they do not take advantage of the wideband behavior when the antenna is not electrically small. Instead of wideband behavior, active dipole antennas have several higher-order resonances.

A Vivaldi antenna (a.k.a., tapered slot antenna) is a co-planar broadband antenna which may be made from a metal sheet, a printed circuit board, or a dielectric substrate metallized on one or both sides. Active wideband Vivaldi antennas have been designed to operate in the range 0.1-10 GHz, but are directional antennas. In many instances, an omnidirectional antenna is required.

A combination of a passive biconical antenna and a passive Vivaldi antenna would enable direction finding. However, such a combination may have degraded sensitivity in the extension band.

SUMMARY

The subject matter disclosed in detail below is directed in part to a biconical antenna (or a single antenna cone) combined with a wideband low-noise buffer amplifier, where the buffer amplifier has high impedance in an extension frequency band defined as a band below the frequency where the biconical antenna is matched to a system impedance (or alternatively is of a certain size). A biconical antenna having an integrated buffer amplifier is referred to herein as an "active biconical antenna". The subject matter disclosed in detail below is further directed to an antenna array comprising an active biconical antenna and a plurality of active Vivaldi antennas. The wideband biconical-type receive antenna disclosed herein operates both in the "traditional band" of operation, where the antenna size is greater than about $\frac{1}{4}\lambda$ at the minimum frequency, and a low-frequency "extension band," where the antenna size is less than $\frac{1}{4}\lambda$. The traditional and extension bands meet at a boundary frequency $f_c$.

The active biconical antenna comprises a biconical (or conical) antenna and a buffer amplifier integrated directly into the feed of the antenna. As used herein, the clause "directly into the feed" means that any transmission line used to connect the feed of the antenna to the buffer amplifier is much shorter than the wavelength at any frequency in the extension band.

The buffer is configured to have high-impedance input in the extension band (i.e., much higher than the impedance of the antenna in the traditional band). In some embodiments, the buffer's input impedance is also high in the traditional band, while in other embodiments, the buffer is impedance matched to the antenna in the extension band. The buffer preferentially comprises field-effect transistors (FETs) having a semiconductor channel made of gallium nitride (GaN). The buffer output is impedance matched to an interface impedance (typically 50, 75 or 100 ohms) over both the traditional and extension bands.

The purpose of integrating a biconical antenna and a buffer amplifier is to extend the useable bandwidth of wideband omni-directional (in an azimuthal plane) receive antennas to lower frequencies without increasing the antenna size (e.g., volume). For example, the receiver sensitivity in an extension band may be improved by 10 dB compared to a passive biconical antenna while being maintained at an unchanged level in a traditional band.

Another aspect of the innovative technology proposed herein involves integrating an active biconical antenna with active Vivaldi antennas to form an array with improved receiver sensitivity in the extension band. Combining the active biconical antenna with active wideband Vivaldi antennas enables direction-finding functionality while also enabling the low-frequency bandwidth extension.

Although an active biconical antenna and a receive array comprising a combination of active biconical and Vivaldi antennas will be described in some detail below, one or more of those embodiments may be characterized by one or more of the following aspects.

One aspect of the subject matter disclosed in some detail below is an active biconical antenna comprising: upper and lower cones, each of the upper and lower cones comprising a respective truncated apex; first and second feed points respectively connected to the truncated apexes of the upper and lower cones; first and second conductors which are respectively connected to the first and second feed points; and a buffer amplifier comprising first and second input terminals which are respectively connected to the first and second conductors. The buffer amplifier has an input impedance that is impedance matched to an antenna impedance at and above but not below a frequency $f_c$ and is higher than the antenna impedance at frequencies substantially less than and an output impedance that is impedance matched to a system impedance at frequencies both above and below $f_c$. A length of the first and second conductors is less than a wavelength at the frequency $f_c$.

In accordance with one embodiment of the active biconical antenna described in the immediately preceding paragraph, the buffer amplifier comprises a field-effect transistor having a gate connected to the first conductor and a source/ground connected to the second conductor in a vicinity of the truncated apex of the lower cone. In accordance with another embodiment, the buffer amplifier comprises first and second field-effect transistors arranged in a cascode configuration; the first field-effect transistor comprises a first gate connected to the first conductor; and the second field-effect transistor comprises a second gate connected to a voltage source. In accordance with a further embodiment, the buffer amplifier comprises first and second field-effect transistors having respective gates connected to the first and second conductors respectively.

In accordance with one embodiment, the buffer amplifier includes a common-source field-effect transistor and a RC feedback circuit that connects the gate and drain of the field-effect transistor. The RC feedback circuit comprises: a resistor connected to the gate of the field-effect transistor, the resistor having a resistance that matches an input impedance of the first buffer amplifier to an impedance of the biconical antenna when the biconical antenna is receiving a signal having a frequency in a traditional band; and a capacitor connected to the resistor and to the drain of the field-effect transistor, the capacitor having a capacitance that prevents feedback in an extension band which extends from the traditional band to a frequency less than the lowest frequency of the traditional band.

Another aspect of the subject matter disclosed in some detail below is a direction finding system comprising: a biconical antenna; a Vivaldi antenna; a receiver having a plurality of ports; a first buffer amplifier having inputs connected to the biconical antenna and having an output connected to a first port of the plurality of ports; and a second buffer amplifier having inputs connected to the Vivaldi antenna and having an output connected to a second port of the plurality of ports.

A further aspect of the subject matter disclosed in some detail below is an active conical antenna comprising: a cone comprising a truncated apex and a feed point connected to the truncated apex; a ground plane; first and second conductors which are respectively connected to the feed points and the ground plane; and a buffer amplifier comprising first and second input terminals which are respectively connected to the first and second conductors. The buffer amplifier has an input impedance that is impedance matched to an antenna impedance at and above but not below a frequency $f_c$ and is higher than the antenna impedance at frequencies substantially less than $f_c$, and an output impedance that is impedance matched to a system impedance at frequencies both above and below $f_c$. A length of the first and second conductors is less than a wavelength at the frequency $f_c$.

Other aspects of an active biconical antenna and receive array comprising a combination of active biconical and Vivaldi antennas are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the appended diagrams are drawn to scale.

DETAILED DESCRIPTION

Figure 1:
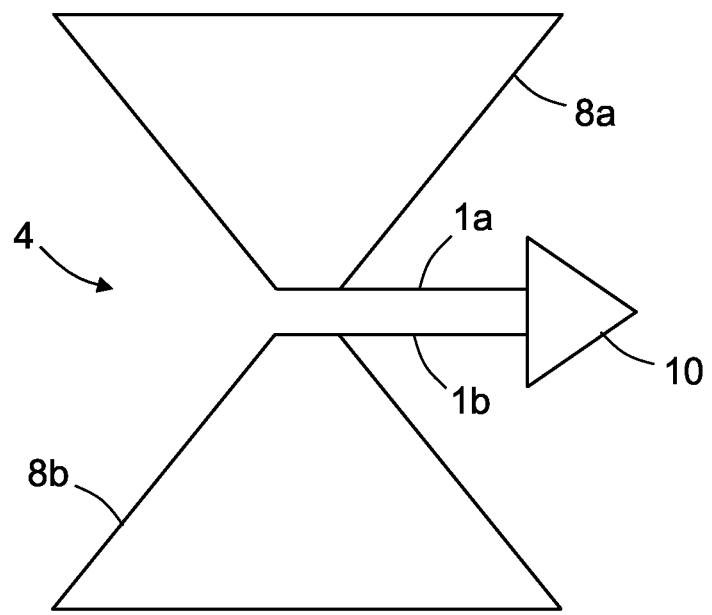
FIG. 1 is a diagram representing a biconical antenna that includes a pair of antenna cones connected to a low-noise buffer amplifier in accordance with a first embodiment.

Illustrative embodiments of an active biconical antenna and a receive array comprising a combination of active biconical and Vivaldi antennas are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Wideband receive antennas that operate both in a "traditional band" of frequencies, where the antenna size is greater than one-half wavelength at the minimum frequency $f_c$ in that band, and also in a low-frequency "extension band," where the antenna size is less than one-half wavelength. The frequency $f_c$ defines a boundary between the traditional and extension frequency bands of operation. The traditional band has gain within a certain amount of a nominal or average, but the extension band is a range of frequencies outside of the traditional band where the gain of the passive antenna is less than the amount, typically 3 dB down.

As used herein "directly into the feed" and "directly into the feed point" mean that any transmission line used to connect the antenna to an input element of the buffer amplifier (for example, the gate of an FET) is much shorter than a wavelength at any frequency in the extension band (preferably less than 0.1 wavelength at any frequency in the extension band) and also preferably less than ¼ wavelength at any frequency in the traditional band. The buffer amplifiers are preferably configured to possess high gain and low noise when noise-matched to an antenna impedance $Z_a$ (typically different than 50 ohms). The antenna impedance $Z_a$ is chosen as the input impedance of the antenna in the traditional band. The buffer amplifier is tied to a common ground node that may be floating relative to the antenna. These buffers preferably comprise GaN FET transistors and are preferably implemented on a single semiconductor die or module. The buffer outputs are preferably impedance matched to an interface impedance (typically 50, 75 or 100 ohms) and may be further coupled to either a combining network or to a receiver.

A biconical antenna typically includes two conductive cones of height h and rotationally symmetric angle α. The cones are preferably arranged such that they are aligned along the same axis of rotational symmetry and they share an apex point. The point of each cone is removed to allow for insertion of two feed contacts. The cones have a conductive surface, which may be achieved by solid conductor (e.g. metal), wire mesh or screen, or a plurality of linear conductors that flare out from an apex. In the traditional band of operation, the impedance is determined by the flare angle alpha α. The upper frequency limit depends on how small the apex can be, whereas the lower limit depends on the flare angle and height. When the size of the antenna is much greater than a wavelength, the antenna is effectively described only by the flare angle α, which results in a "frequency-independent antenna". As the wavelength increases such that the size is on the order of one half-wavelength, a passive biconical antenna becomes resonant. As the wavelength increase further, the antenna behaves as a short dipole and is primarily capacitive and the radiation resistance decreases. Therefore, the radiation quality factor increases and it becomes impossible to achieve a passive conjugate impedance match over a wide bandwidth. In the prior art, it is common to design the antenna to be impedance matched to 50 ohms in the high-frequency traditional band. Any operation in the low-frequency extension band is known to have poor realized gain and, therefore, poor receiver sensitivity.

The innovative antenna configurations disclosed herein overcome the limitations set forth in the immediately preceding paragraph using low-noise buffer amplifiers integrated directly into the antenna feed to overcome these challenges. The buffer is configured to transmit the signal induced on the antenna cones by the incident wave to the output, but to have an output impedance that is insensitive to the antenna impedance.

FIG. 1 is a diagram representing a biconical antenna 4 that includes a pair of antenna cones connected to a buffer amplifier 10 in accordance with a first embodiment. More specifically, the biconical antenna 4 includes an upper antenna cone 8a and a lower antenna cone 8b. The buffer amplifier 10 has respective inputs connected to respective feed points 18 at the apexes of upper antenna cone 8a and lower antenna cone 8b by short feed conductors 1a and 1b. The electrical length of the feed conductors 1a and 1b is much shorter than the wavelength in the extension band. In this example, the short feed conductors 1a and 1b run perpendicular to the cone axis. In this embodiment, it is preferred that the receiver conductors are perpendicular to the antenna polarization to avoid scattering of the incident wave by the feed line. Furthermore, it is preferable that the buffer amplifier 10 have a differential input in this embodiment.

Figure 2:
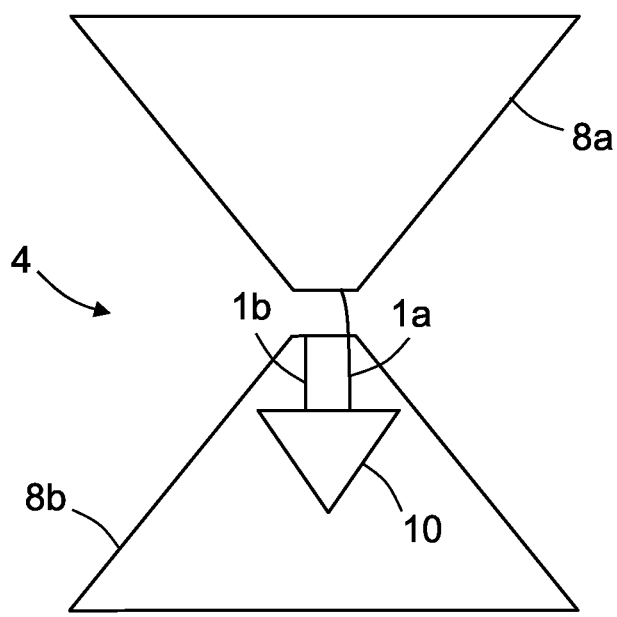
FIG. 2 is a diagram representing a biconical antenna that includes a pair of antenna cones connected to a low-noise buffer amplifier disposed inside the lower antenna cone in accordance with a second embodiment.

FIG. 2 is a diagram representing a biconical antenna 4 that includes an upper antenna cone 8a and a lower antenna cone 8b connected to buffer amplifier 10 by way of short feed conductors 1a and 1b in accordance with a second embodiment. In this embodiment, the buffer amplifier 10 is arranged inside the lower antenna cone 8b. A feed-through is provided near the apex of the lower antenna cone 8b. One input terminal of buffer amplifier 10 is connected to the lower antenna cone 8b in the vicinity of the feed-through; another input terminal of buffer amplifier 10 passes through the feed-through and is connected to the upper antenna cone 8a at its truncated apex. In this embodiment, it is preferred that the buffer have a single-ended input.

Figure 3:
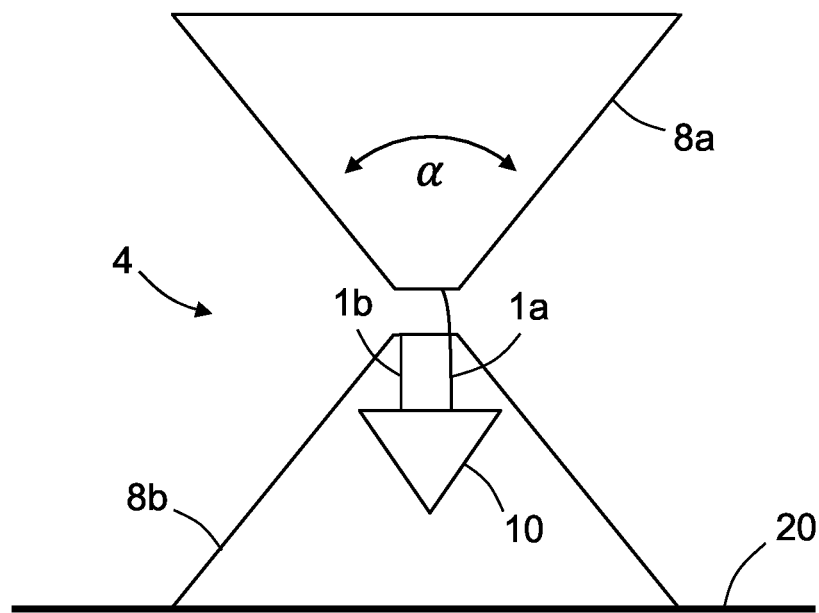
FIG. 3 is a diagram representing a biconical antenna that includes a pair of antenna cones connected to a low-noise buffer amplifier disposed inside an antenna cone connected to a ground plane in accordance with a third embodiment.

FIG. 3 is a diagram representing a biconical antenna 4 in accordance with a third embodiment. The biconical antenna 4 depicted in FIG. 3 includes an upper antenna cone 8a and a lower antenna cone 8b connected to buffer amplifier 10 by way of short feed conductors 1a and 1b (in a manner identical to the arrangement depicted in FIG. 2). The third embodiment differs from the second embodiment in that the lower antenna cone 8b is seated on and connected to a ground plane.

Figure 4:
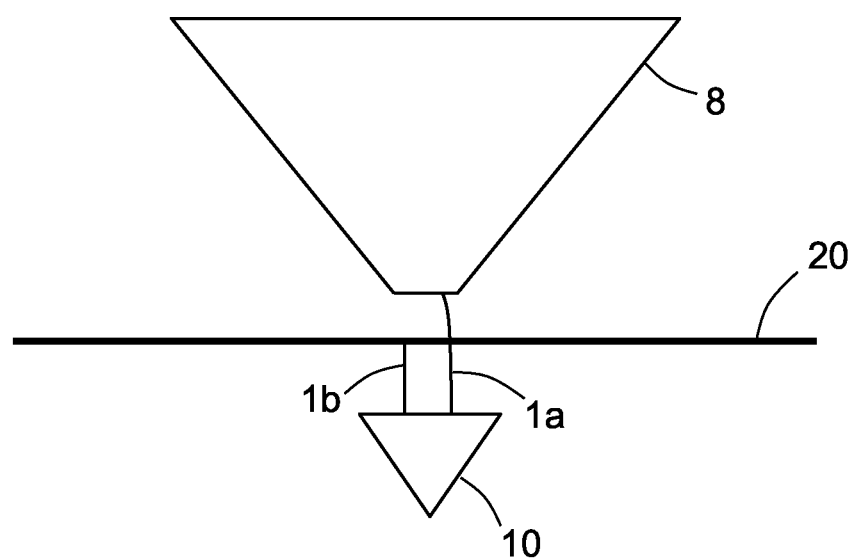
FIG. 4 is a diagram representing a conical antenna that includes a single antenna cone connected to one input of a low-noise buffer amplifier, the other input of the low-noise buffer amplifier being connected to a ground plane in accordance with a fourth embodiment.

FIG. 4 is a diagram representing a conical antenna that includes a single antenna cone 8 connected to one input of a buffer amplifier 10, the other input of buffer amplifier 10 being connected to a ground plane 20 in accordance with a fourth embodiment. The ground plane 20 comprises a feed-through in the vicinity of a truncated apex. The first input terminal of the buffer amplifier 10 is connected to the ground plane 20 in the vicinity of the feed-through and the second input terminal of the buffer amplifier 10 is connected to the antenna cone 8 by means of a conductor 1a.

The buffer amplifier 10 preferably includes a common-source input stage comprising field-effect transistors, preferably gallium nitride (GaN) transistors. The input impedance of buffer amplifier 10 is preferably high in the low-frequency extension band and matched to an antenna impedance in the traditional band, preferably 50 ohms. The output impedance is preferably matched to a system impedance (e.g., 50 ohms) over both the low-frequency extension band and the high-frequency traditional band.

Figure 5:
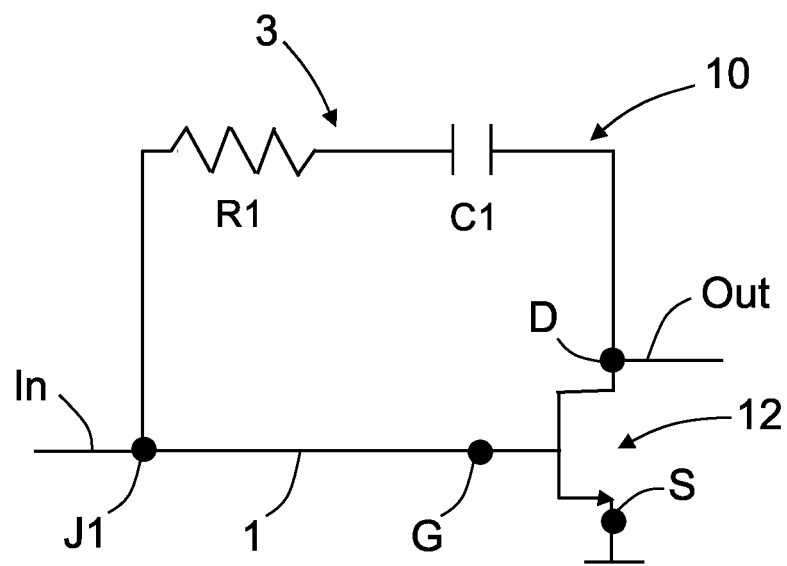
FIG. 5 is a circuit diagram representing components of a low-noise buffer amplifier having a high-impedance input, a single-ended output, and frequency-dependent shunt feedback in accordance with one embodiment.

FIG. 5 is a circuit diagram representing components of a low-noise buffer amplifier 10 having a high-impedance input, a single-ended output, and frequency-dependent shunt feedback in accordance with one embodiment. The low-noise buffer amplifier 10 includes an FET 12 having a source S connected to ground and an RC circuit 3 that provides frequency-dependent shunt feedback. The source/ground is connected to the lower cone of a biconical antenna in the vicinity of the feed-through. The RC circuit 3 is connected across junction J1 and drain D of FET 12. Junction J1 is connected to gate G of FET 12 by a feed conductor 1. Resistor R1 is chosen to provide impedance matching as described above. Capacitor C1 is chosen to prevent this feedback in the low-frequency extension band. This results in increased gain and high-input impedance.

Figure 6:
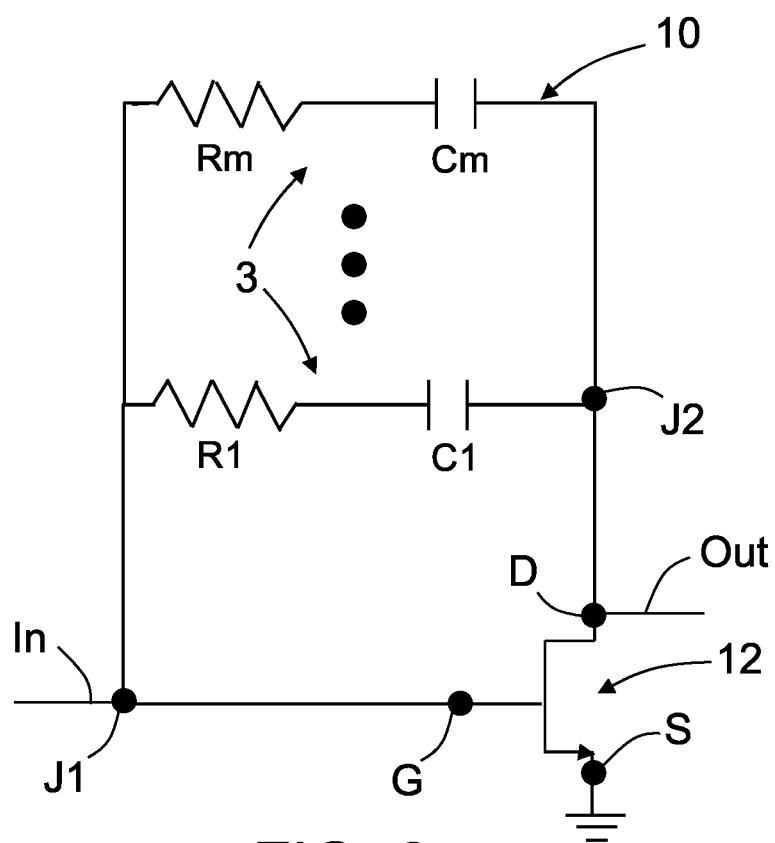
FIG. 6 is a circuit diagram representing components of a low-noise buffer amplifier having a high-impedance input, a single-ended output, and frequency-dependent shunt feedback in accordance with another embodiment.

In accordance with a preferred embodiment shown in FIG. 6, the buffer amplifier 10 includes an FET 12 having a source S connected to ground and an RC network comprising multiple RC circuits 3 that provide a gradual roll-off of the feedback. More specifically, the RC network includes m RC circuits 3 connected in parallel across junctions J1 and J2. The first RC circuit includes a resistor R1 connected in series with a capacitor C1. The m-th RC circuit includes a resistor Rm connected in series with a capacitor Cm. The result is a buffer amplifier having a high-impedance input, a single-ended output, and frequency-dependent shunt feedback.

Figure 7:
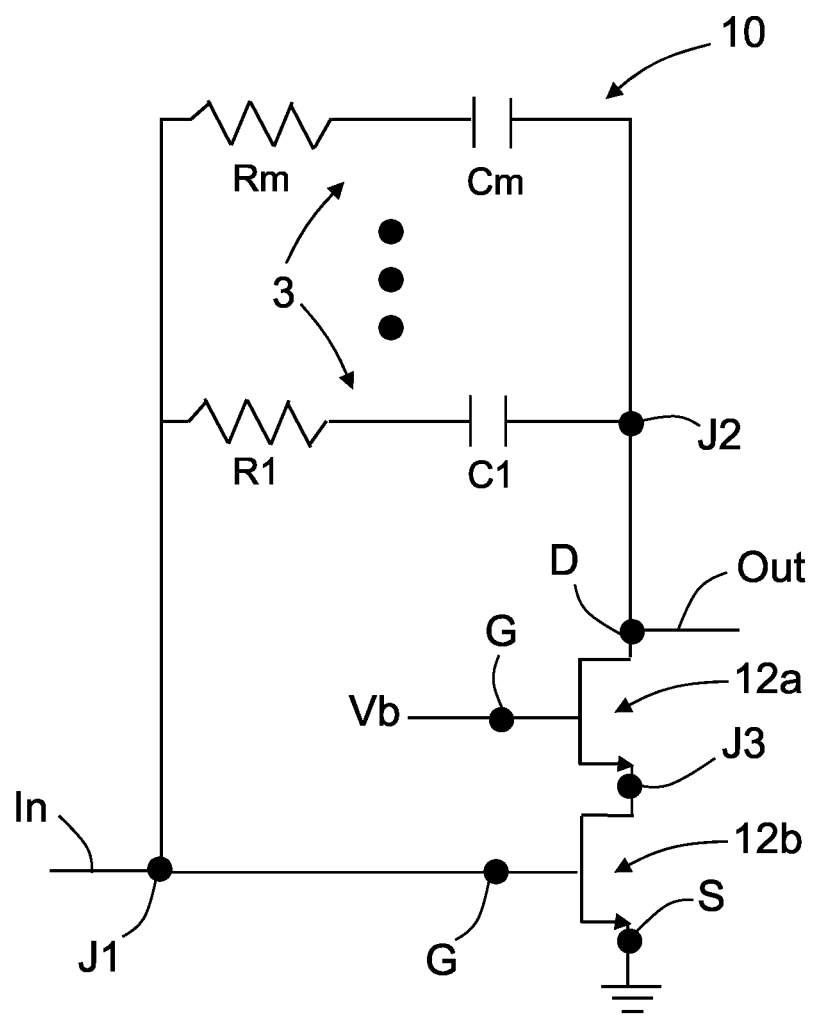
FIG. 7 is a circuit diagram representing components of a two-stage low-noise buffer amplifier having a high-impedance input, a single-ended output, and an RC network that provides a gradual roll-off of the feedback in accordance with a further embodiment.

It is further preferred to use a cascode configuration to reduce the input Miller capacitance that can degrade wideband impedance matching at the high frequencies. FIG. 7 is a circuit diagram representing components of a two-stage low-noise buffer amplifier having a high-impedance input, a single-ended output, and an RC network that provides a gradual roll-off of the feedback in accordance with a further embodiment. The two-stage low-noise buffer amplifier includes a common-source stage feeding into a common-gate stage to reduce the Miller effect feedback capacitance from the drain to the gate of the FET 12b. The cascode configuration includes an FET 12b having a gate G connected to junction J1, a source S connected to ground, and a drain D connected to junction J3; and an FET 12a having a gate G connected to a voltage source Vb, a source S connected to junction J3, and a drain D connected to junction J2. The single-ended input of the buffer amplifier 10 depicted in FIG. 7 is connected to junction J1, while the single-ended output is connected to drain D of FET 12a It can be challenging to achieve stability of the buffer depicted in FIG. 5 because the requirement to place the cutoff frequency in the operating band reduces the phase margin. At high frequencies, the phase is 0 degrees; at the RC pole, it is 45 degrees; and below the RC pole it is 90 degrees. This makes unconditional stability difficult to achieve because an inductive source impedance will provide additional phase. This is shown in FIGS. 8-11.

Figure 8:
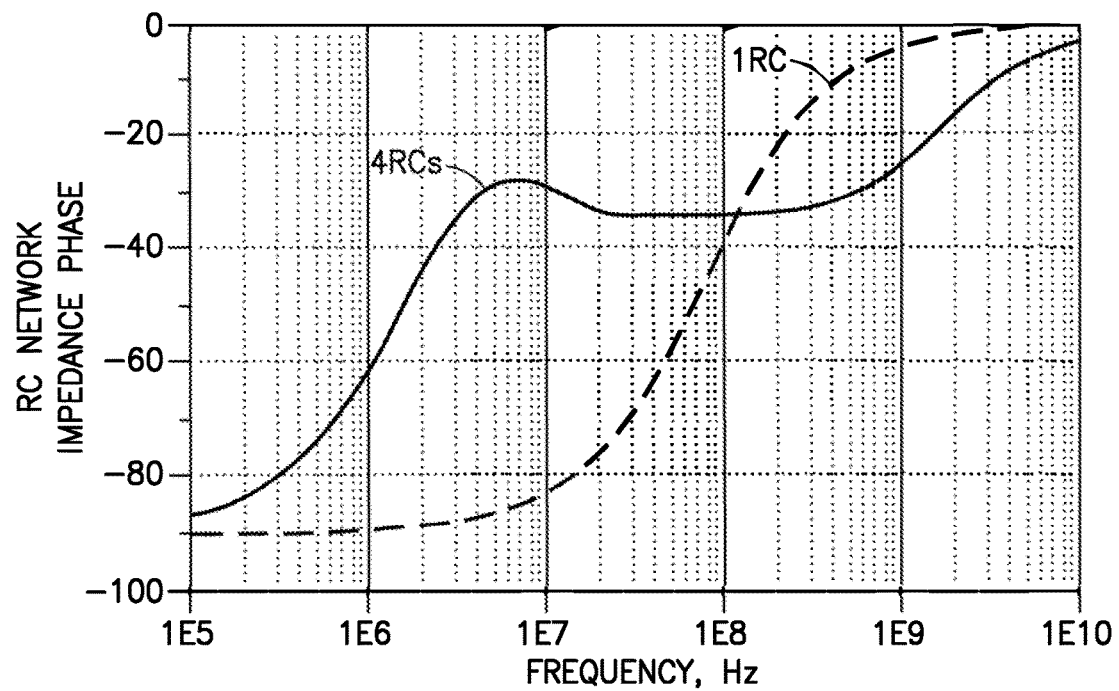
FIGS. 8 and 9 are graphs plotting the simulated impedance phase and magnitude respectively of an RC feedback network versus the frequency of the received signal for two simulated low-noise buffer amplifiers: one simulated buffer amplifier having one RC feedback circuit (phase indicated by a dashed curve) and the other simulated buffer amplifier having four parallel RC circuits (phase indicated by a solid curve).
Figure 9:
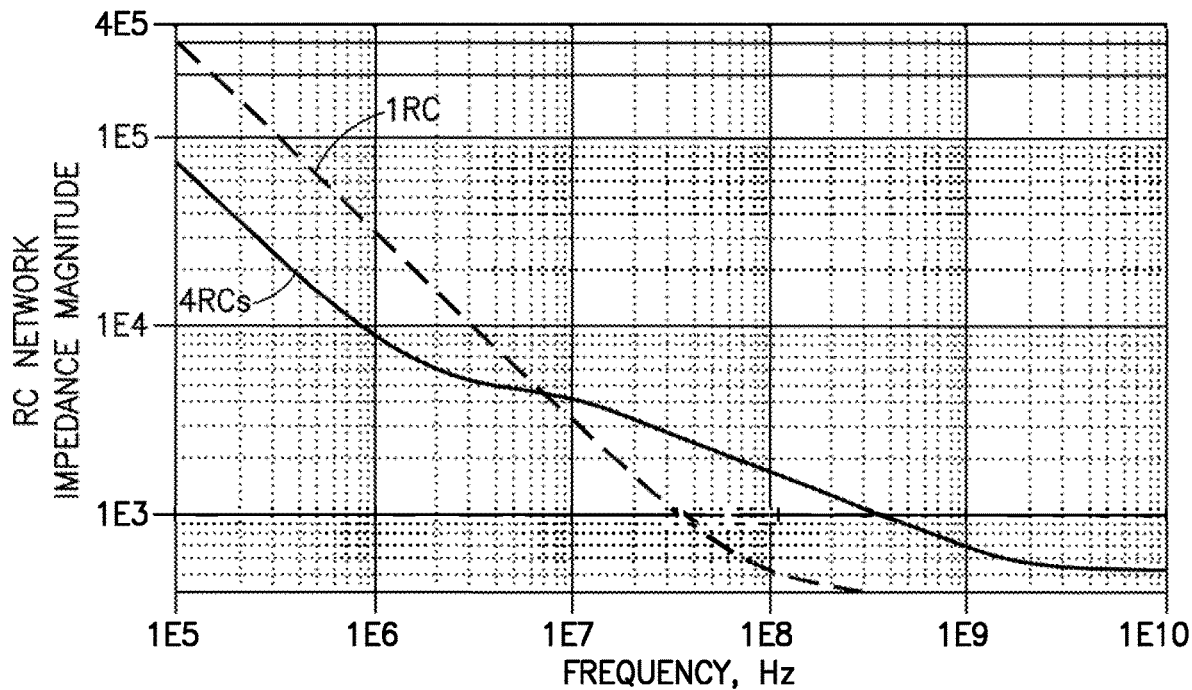

FIGS. 8 and 9 are graphs plotting the simulated impedance phase and magnitude respectively of the RC feedback network versus the frequency of the received signal for two simulated low-noise buffer amplifiers: one simulated buffer amplifier having one RC feedback circuit as depicted in FIG. 5 (phase indicated by a dashed curve in FIG. 8) and the other simulated buffer amplifier having four (m=4 in FIG. 6) parallel RC circuits (phase indicated by a solid curve in FIG. 8).

Figure 10:
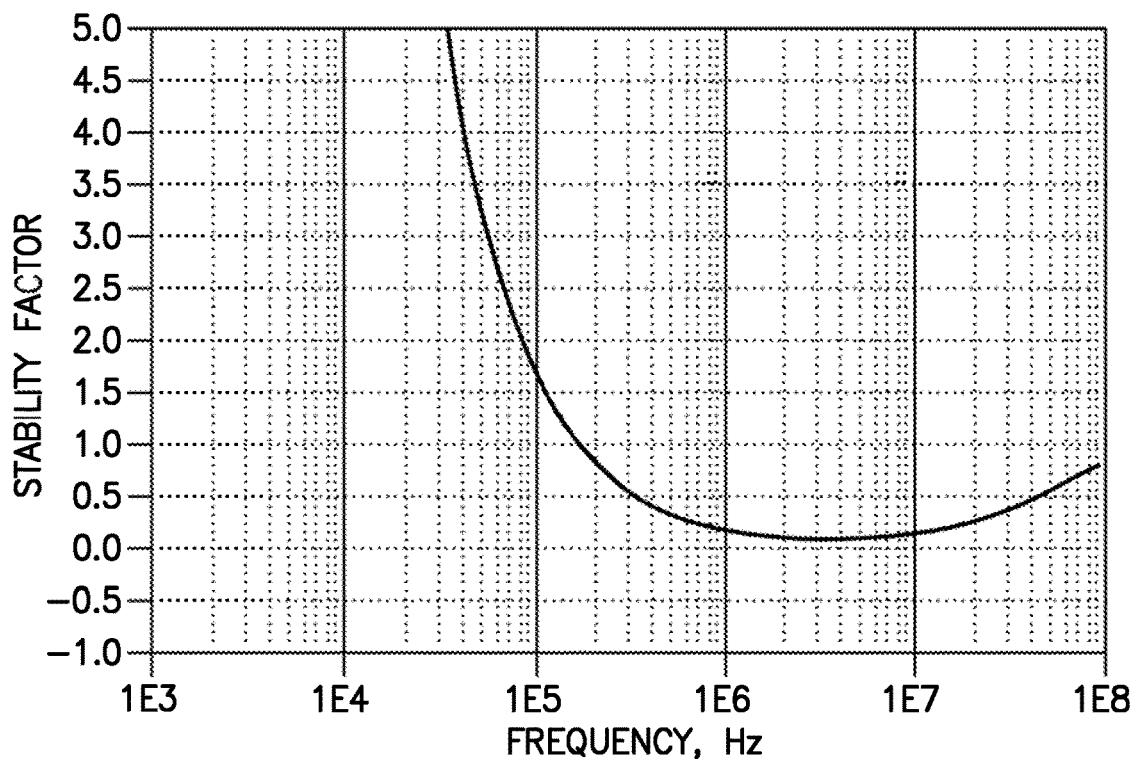
FIGS. 10 and 11 are graphs plotting the associated stability factor versus frequency of received signal for simulated buffer amplifiers having one RC feedback circuit and four parallel RC feedback circuits respectively.
Figure 11:
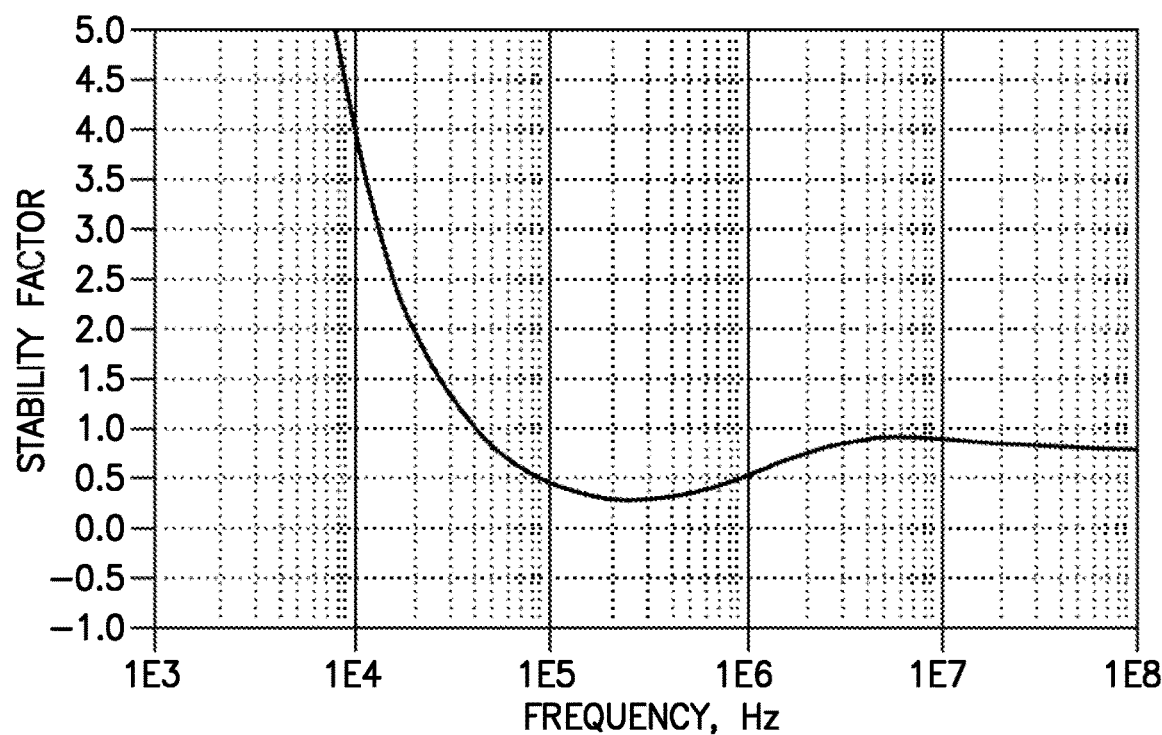

FIGS. 10 and 11 are graphs plotting the associated stability factor versus frequency of received signal for simulated buffer amplifiers having one RC feedback circuit and four parallel RC feedback circuits respectively. With an RC pole of approximately 80 MHz, the stability factor is well below 1 from this point to lower frequencies, as shown in FIG. 10. In the preferred embodiment, multiple RC networks are connected in parallel to provide a gradual roll-off of the feedback (see FIG. 6). FIG. 11 shows the stability factor for a simulated buffer amplifier having four parallel RC circuits. This provides a phase greater than ~30 degrees to much lower frequencies, enabling the feedback to be rolled off with only minor reduction in phase margin. This corresponds to a stability factor that is much closer to unity and can be stabilized with minor performance degradation. It is recommended that potential instabilities be pushed below the operating band, where they can be mitigated with high-pass filtering. It is further preferred to use the cascode configuration depicted in FIG. 7 to reduce the input Miller capacitance that can degrade wideband impedance matching at high frequencies.

Figure 12:
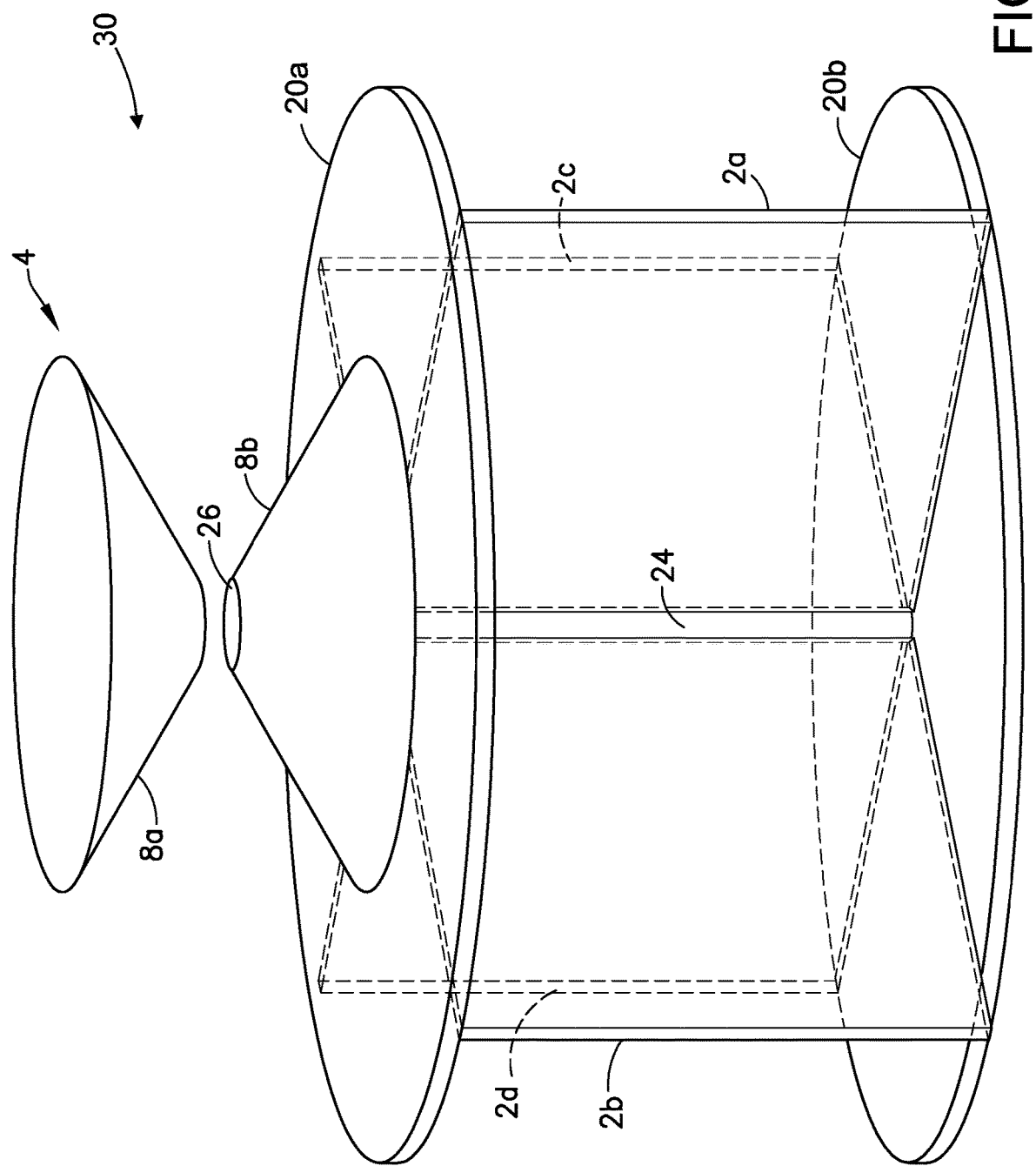
FIG. 12 is a diagram representing a three-dimensional (3-D) view of some components of a direction finding system comprising an active biconical antenna and four active Vivaldi antennas in accordance with one proposed implementation (the buffer amplifiers are not shown).

FIG. 12 is a diagram representing a 3-D view of some components of a receive array 30 comprising an active biconical antenna 4 and four active Vivaldi antennas 2a-2d in accordance with one proposed implementation (the buffer amplifiers are not shown). The direction finding system further includes a top ground plane 20a and a bottom ground plane 20b, each being a metal plate. The biconical antenna 4 includes an upper antenna cone 8a and a lower antenna cone 8b. The aperture 26 of the truncated apex of lower antenna cone 8b is visible in FIG. 12. The aperture 26 enables the aforementioned feed-through of the electrical conductor that connects the buffer amplifier to the upper antenna cone 8a.

In the receive array 30 depicted in FIG. 12, the active Vivaldi antennas 2a-2d are mutually orthogonal and extend upward from the bottom ground plane 20b. The top ground plane 20a sits on top of the active Vivaldi antennas 2a-2d. The lower antenna cone 8b is supported by the top ground plane 20a. The means for supporting the upper antenna cone 8a are not shown in FIG. 12.

In the example depicted in FIG. 12, four active Vivaldi antennas 2a-2d extend radially outward at 90-degree angles.

However, the receive array proposed herein may have a number of Vivaldi antennas different than four, such a one, two, eight or twelve. The Vivaldi antennas extend radially outward from a central tube 24 having an axis which is coaxial with a Z-axis. The ground planes are perpendicular to the Z-axis. An electrical conductor which connects top ground plane 20*a* to bottom ground plane 20*b* passes through the central tube 24. In an alternative embodiment, the tube itself is conductive.

The Vivaldi antennas may be printed circuit boards. The arms of each Vivaldi antenna may be coupled to the top and bottom ground planes and the biconical antenna may be placed above the top ground plane and electrically coupled to a buffer amplifier 10 in the manner depicted in FIG. 3. In accordance with one proposed implementation, the buffer amplifiers for the Vivaldi antennas are placed on the respective printed circuit boards as close as possible to the antenna feeds. The buffer amplifier for the biconical antenna is placed as close as possible to the apexes of the antennas cones, which may be inside the lower antenna cone 8*b* or inside the tube 24.

Figure 13:
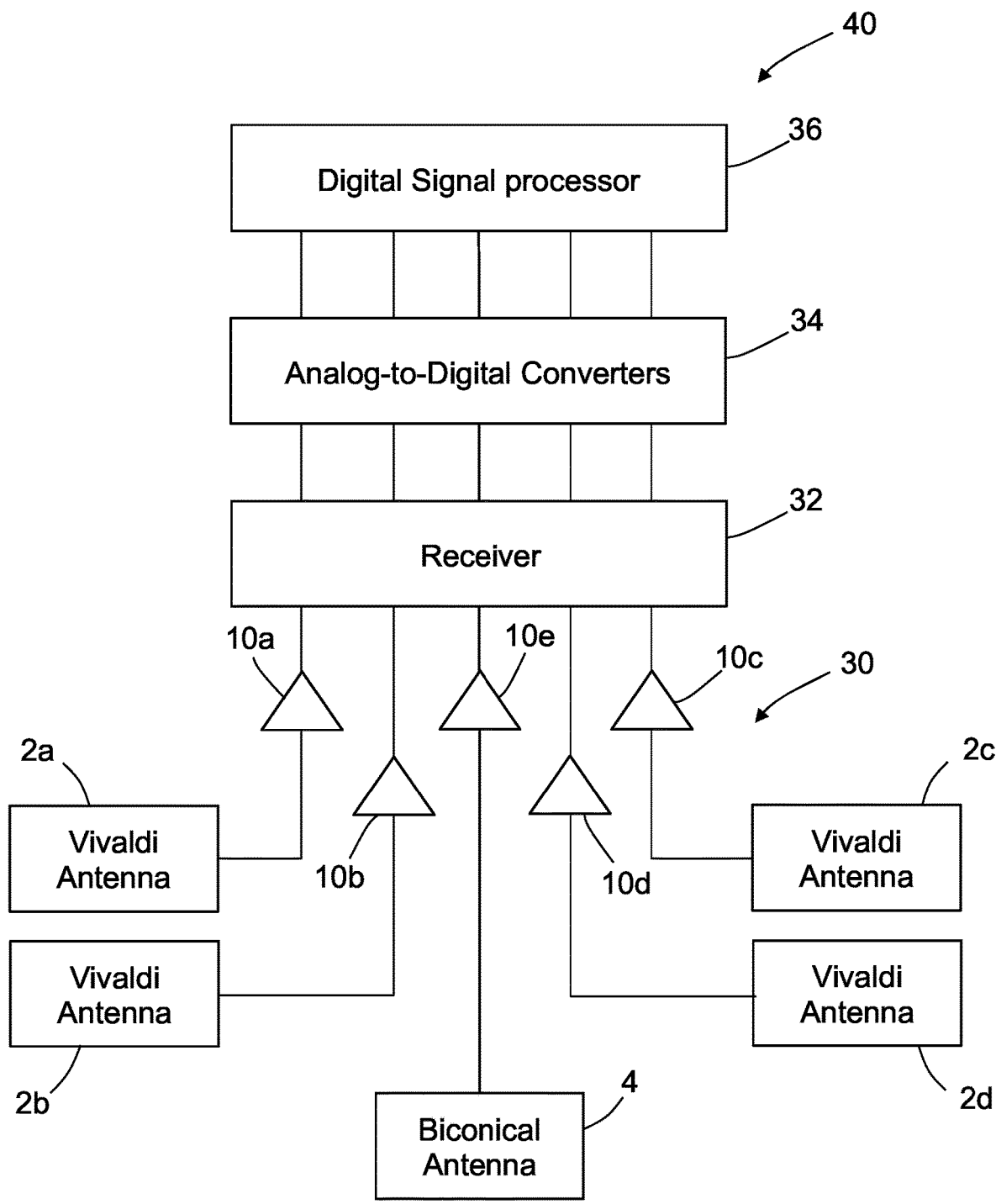
FIG. 13 is a block diagram identifying components of a direction finding system comprising an active biconical antenna and four active Vivaldi antennas in accordance with one embodiment.

FIG. 13 is a block diagram identifying components of a direction finding system 40 comprising a receive array 30 connected to a receiver 32 having multiple channels. The direction finding system 40 further includes a digital signal processor 36 having a plurality of input ports and a plurality of analog-to-digital converters 34 which convert analog signals from receiver 32 into digital signals for digital signal processing. The analog-to-digital converters 34 have respective inputs connected to the output ports of receiver 32 and respective outputs connected to the input ports of digital signal processor 36.

In accordance with the proposed implementation depicted in FIG. 13, the receive array 30 of direction finding system 40 includes the following components: (a) a first Vivaldi antenna 2*a* connected to a first buffer amplifier 10*a*; (b) a second Vivaldi antenna 2*b* connected to a second buffer amplifier 10*b*; (c) a third Vivaldi antenna 2*c* connected to a third buffer amplifier 10*c*; (d) a fourth Vivaldi antenna 2*d* connected to a fourth buffer amplifier 10*d*; and (e) a biconical antenna 4 connected to a fifth buffer amplifier 10*e*. The outputs of the first through fifth buffer amplifiers 10*a*-10*e* are connected to respective channels of receiver 32.

The performance of a receive array having eight Vivaldi antennas extending radially outward from a central tube at 45-degree angular intervals was simulated. The simulated buffer amplifier was designed according to FIG. 7, wherein both FETs 12*a* and 12*b* were GaN FETS having a gate length of 0.25 micron. The feedback network includes 4 RC circuits, plus input and output matching networks. A reception model was generated which simulated the antenna gain and receiver sensitivity of the buffers coupled to the antennas based on full-wave simulations of the antenna and detailed noise simulations of the buffer amplifiers. This performance was simulated for both a passive antenna (as depicted in FIG. 12, except including eight Vivaldi antennas) with an active antenna (including the buffers depicted in FIG. 7). For comparison, in both cases it was assumed that the antenna is coupled to a receiver with a 5-dB noise figure.

Figure 14:
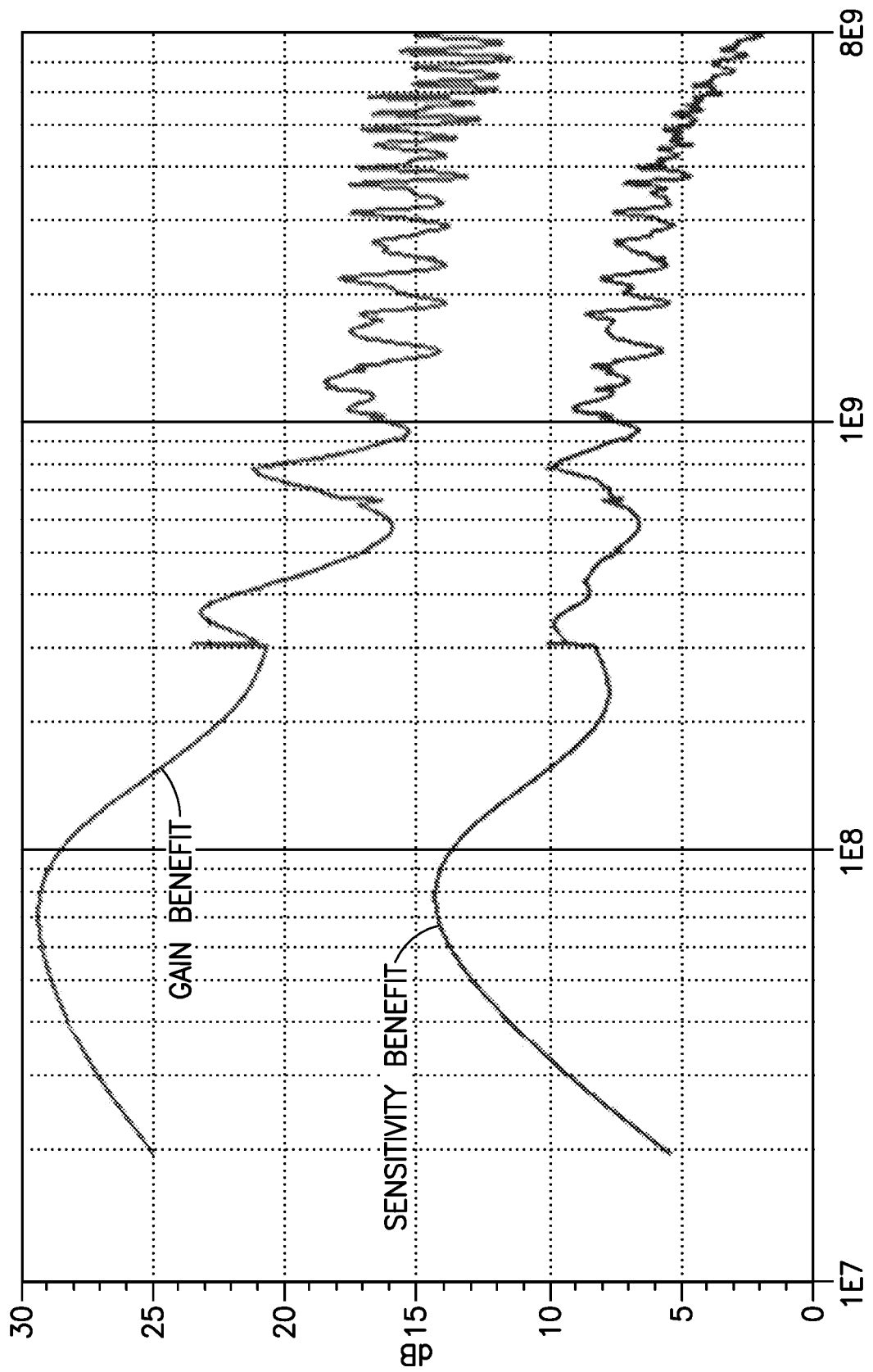
FIG. 14 is a graph plotting the simulated gain and sensitivity benefits of a simulated active Vivaldi antenna having integrated buffers as proposed herein.
Figure 15:
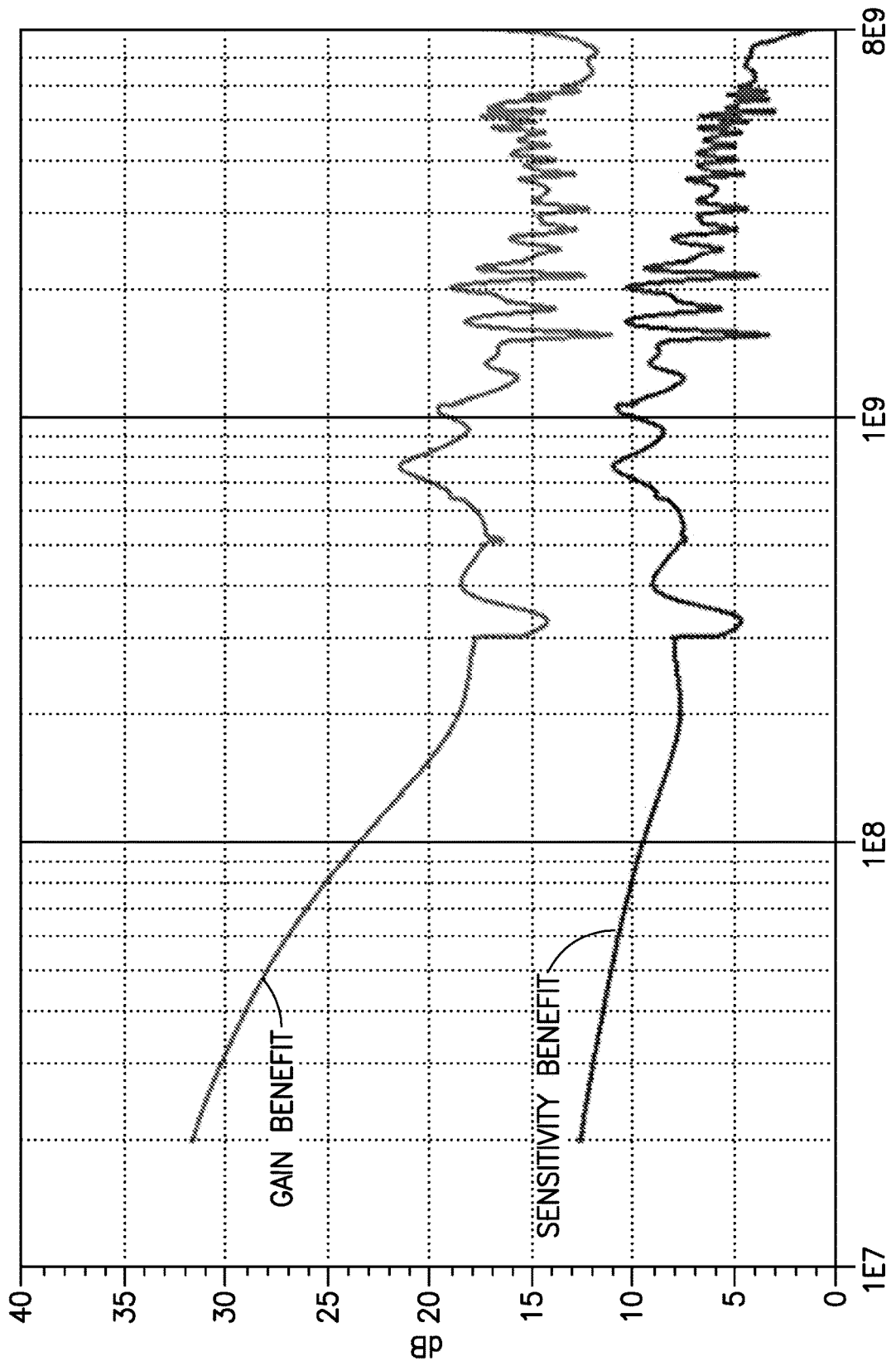
FIG. 15 is a graph plotting the simulated gain and sensitivity benefits of a simulated active biconical antenna having integrated buffers as proposed herein.

FIG. 14 is a graph plotting the simulated gain and sensitivity benefits of an active Vivaldi antenna having integrated buffer amplifiers as proposed herein. FIG. 15 is a graph plotting the simulated gain and sensitivity benefits of an active biconical antenna having integrated buffer amplifiers as proposed herein. The gain benefit is the ratio of the realized antenna gain with the buffers to the realized antenna gain without the buffers. To first order, this ratio is the gain of the buffers, but second-order effects of impedance match also affect the values. The sensitivity benefit is the ratio of the minimum detectable signal (MDS) without the buffers to the MDS with the buffers. It is apparent that the sensitivity benefit is higher than the assumed 5-dB receiver noise figure. This shows that the improvement is not solely due to overcoming receiver noise with amplifier gain. Rather, it is due to advantageous pairing of the antennas with the low-noise buffers.

Figure 16:
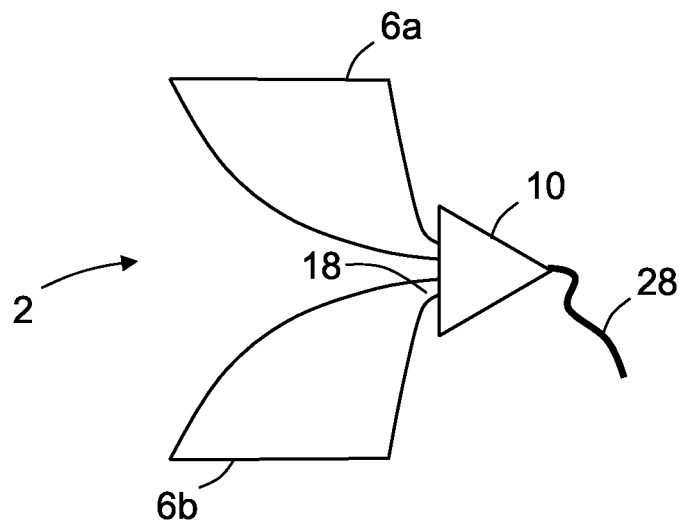
FIG. 16 is a diagram representing several components of an active Vivaldi antenna having an integrated buffer amplifier.

FIG. 16 is a diagram representing several components of an active Vivaldi antenna 2 having an integrated buffer amplifier 10. The active Vivaldi antenna 2 includes a pair of balanced arms 6*a* and 6*b* which emanate from a throat region at the antenna's feed point 18. The output of buffer amplifier 10 is connected to a receiver (not shown in FIG. 17, but see receiver 32 in FIG. 13) by means of a conductor 28.

Figure 17:
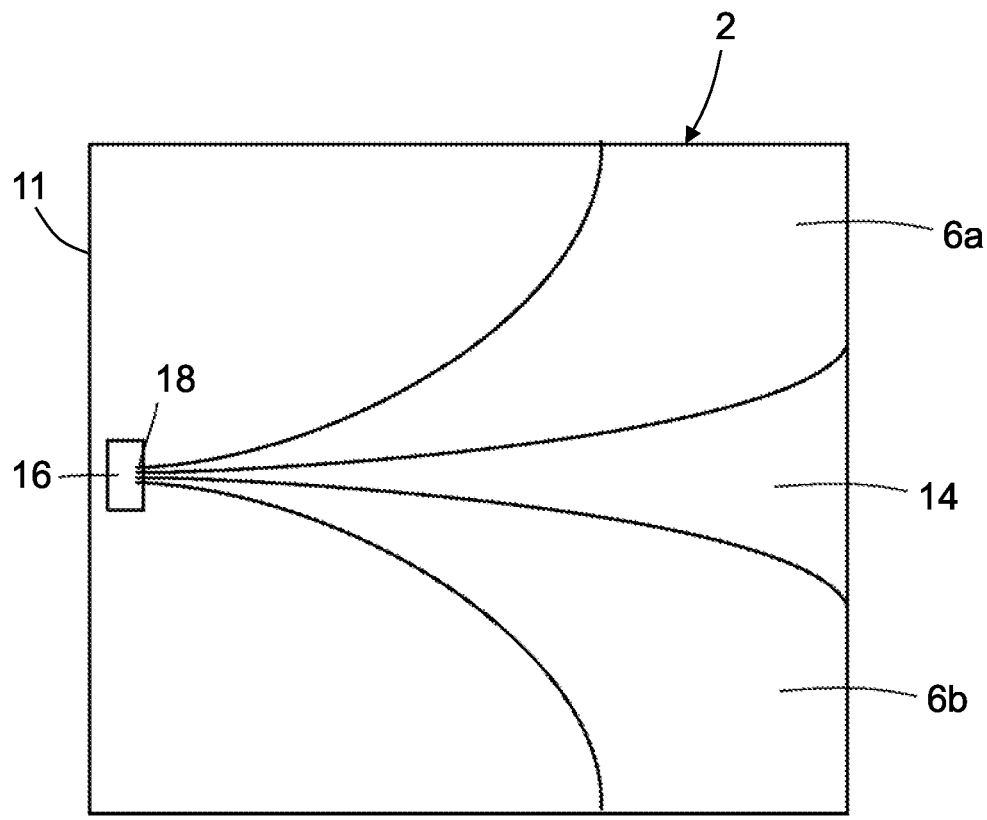
FIG. 17 is a diagram representing a printed wiring board that includes a dielectric substrate, two arms of a Vivaldi antenna, and a buffer amplifier disposed as close as reasonably possible to the proximate ends of the arms in accordance with one embodiment.

FIG. 17 is a diagram representing a printed circuit board 11 in accordance with one embodiment. The printed circuit board 11 includes a dielectric substrate 14, two arms 6*a* and 6*b* of a Vivaldi antenna 2, and a buffer amplifier chip 16 disposed as close as reasonably possible to the feed points 18 at the proximate ends of arms 6*a* and 6*b*. The arms 6*a* and 6*b* of the Vivaldi antenna 2 may be layers of metallization on the surfaces of the dielectric substrate 14. The buffer amplifier chip 16 may be an integrated circuit that includes GaN FETs arranged so that feed contacts on the chip 16 are bonded directly to respective feed points 18 at the proximate ends of arms 6*a* and 6*b* of the Vivaldi antenna 2. The feed points 18 are disposed close to the gates G of the FETs of the buffer amplifier. Transmission lines of length d connect the feed points 18 at the ends of arms 6*a* and 6*b* of the Vivaldi antenna 2 These transmission lines are preferably fabricated as short as reasonably possible by forming the gates G of the FETs next to the aforementioned feed contacts 38, as shown in FIGS. 18-21.

Figure 18:
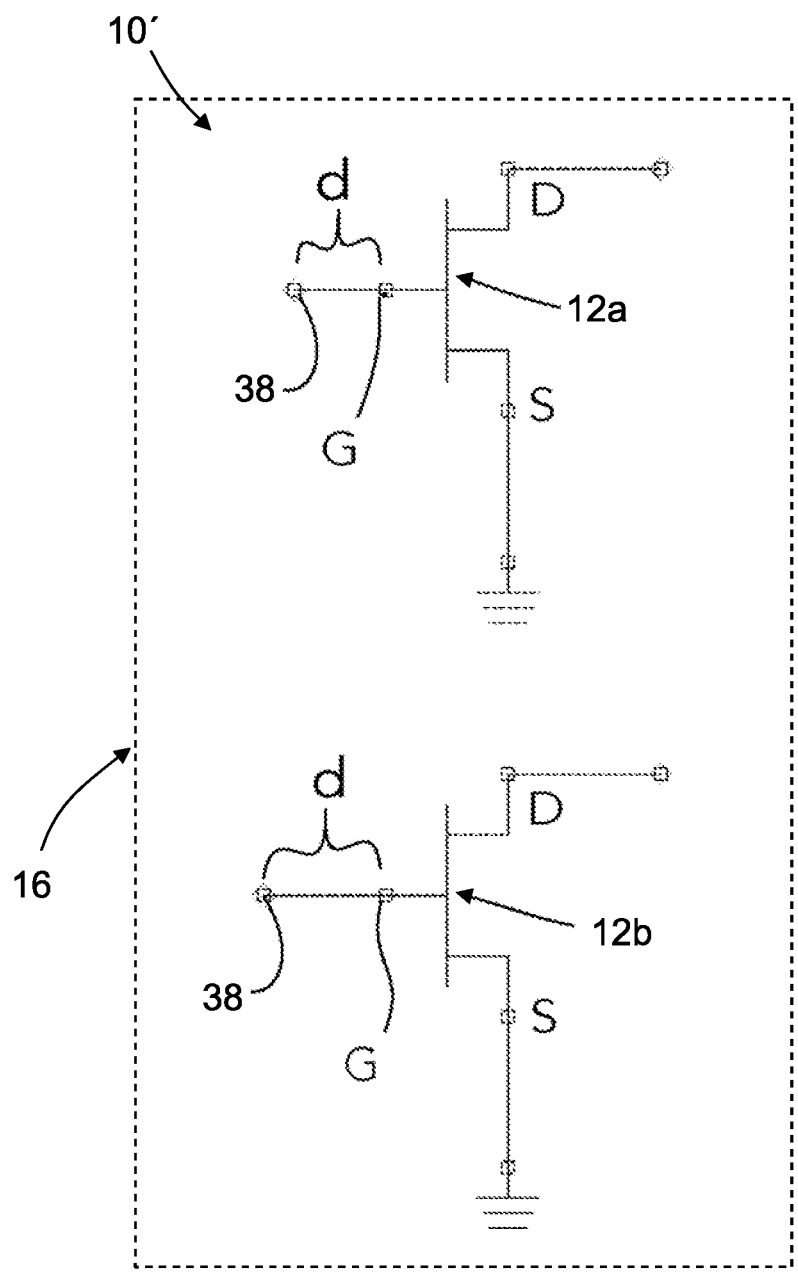
FIG. 18 is a circuit diagram representing components of a buffer amplifier having high-impedance inputs and no feedback in accordance with a first embodiment.

FIG. 18 is a circuit diagram representing components of a buffer amplifier 10' having high-impedance inputs and no feedback in accordance with a first embodiment. The buffer amplifier 10' depicted in FIG. 18 includes a pair of FETs 12*a* and 12*b* (e.g., GaN FETs) configured to provide differential outputs to a receiver (not shown in FIG. 18; also bias networks for the buffer amplifier are not shown). Each FET has a gate G connected to a respective feed contact 38 of chip 16, a source S connected to a common ground node, and a drain D connected to a respective buffer amplifier output. The differential outputs are taken to the receiver or, optionally, a second amplification stage (not shown).

A respective buffer amplifier 10' of the type depicted in FIG. 18 may be substituted for each of the buffer amplifiers 10*a*-10*e* depicted in FIG. 13. In each instance, the buffer amplifier 10' comprises a differential pair of common-source amplifiers directly coupled to respective ones of the balanced feed terminals (feed contacts 38) of the Vivaldi or biconical antenna. This connection may be made with a transmission line matched to the antenna impedance in the traditional band, but may also be made with another arrangement of two conductors (e.g., wires or traces not arranged in a conventional transmission line).

Each gate G depicted in FIG. 18 is separated from the respective feed contact 38 on chip 16 by a distance d. In accordance with one proposed implementation, the length d of this connection between the antenna terminals and each FET in the buffer amplifier 10' is equal to the wavelength at the highest frequency of the extension band (which is 1 GHz in this example).

Figure 19:
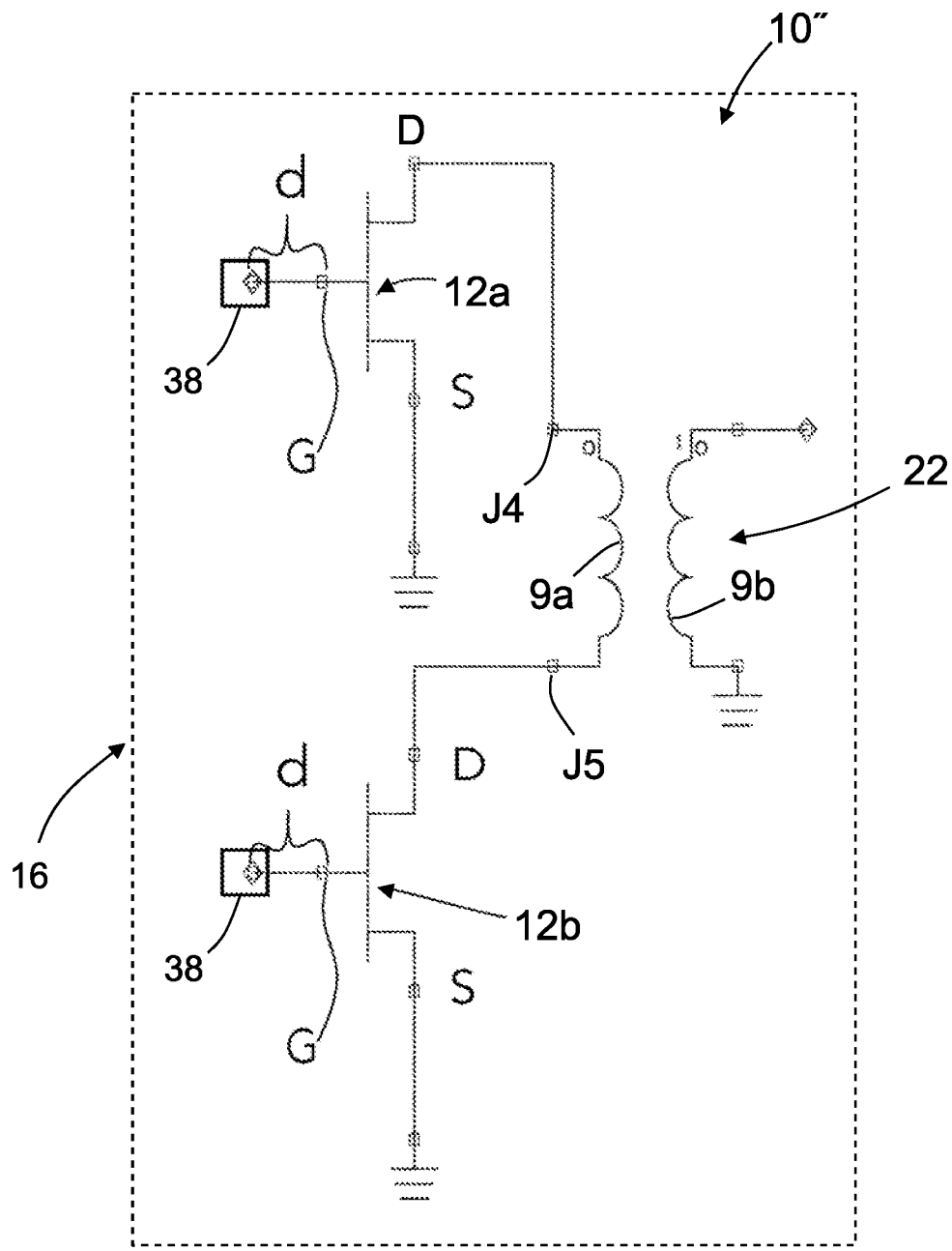
FIG. 19 is a circuit diagram representing components of a buffer amplifier having high-impedance inputs and no feedback in accordance with a second embodiment.

FIG. 19 is a circuit diagram representing components of a buffer amplifier 10" having high-impedance inputs and no feedback in accordance with a second embodiment. The buffer amplifier 10" depicted in FIG. 19 includes a pair of FETs 12a and 12b (e.g., GaN FETs) and a transformer 22 configured to provide a single-ended output to a receiver (not shown in FIG. 19; also bias networks for the buffer amplifier are not shown). Each FET has a gate G connected to a respective feed contact 38, a source S connected to a common ground node, and a drain D connected to respective junctions J4 and J5. More specifically, the drain of FET 12a is connected to junction J4; the drain of FET 12b is connected to junction J5. The transformer 22 includes a pair of windings 9a and 9b. Winding 9a is connected across junctions J4 and J5. Winding 9b has one terminal connected to ground and the other terminal connected to the output of buffer amplifier 10".

Figure 20:
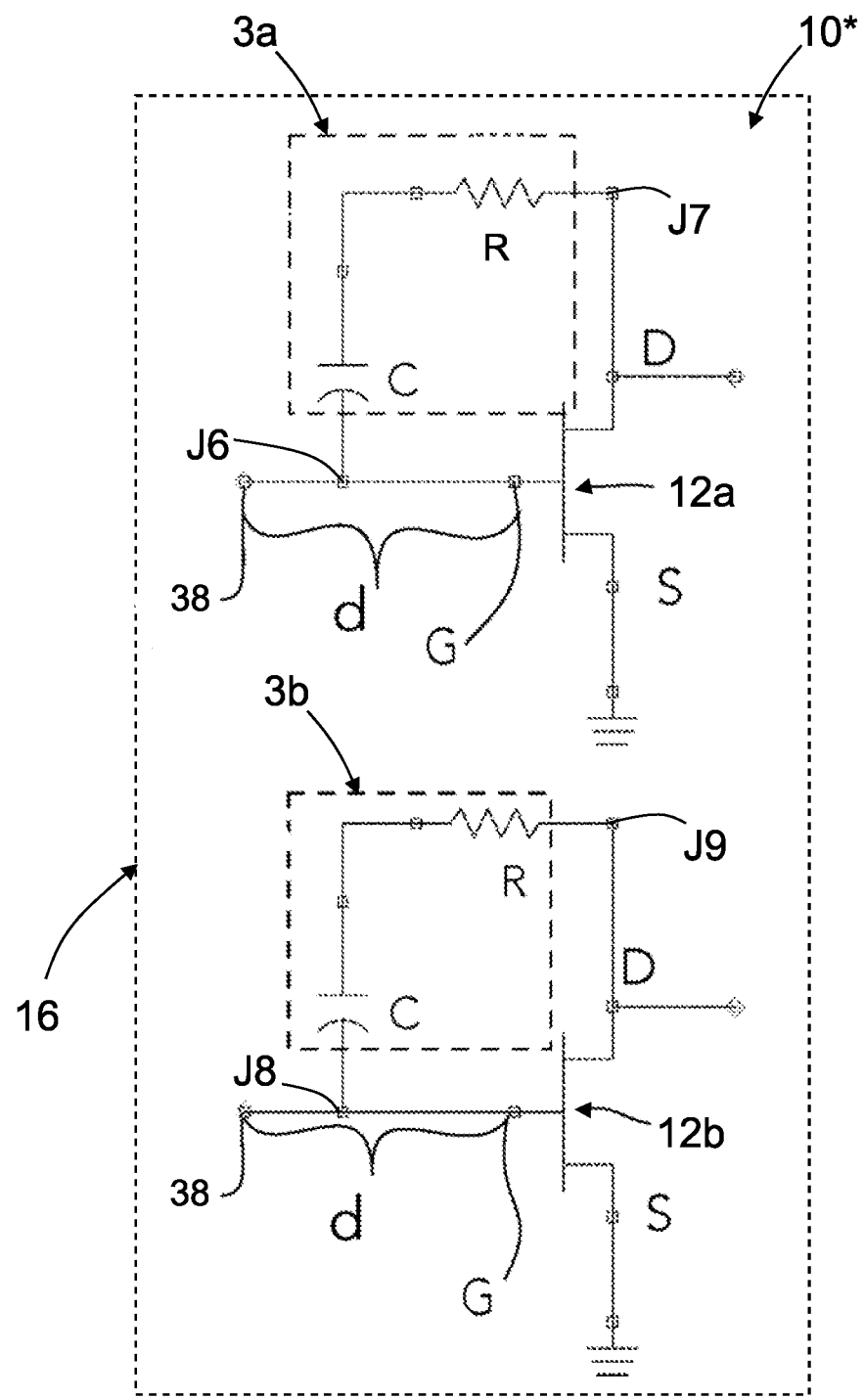
FIG. 20 is a circuit diagram representing components of a buffer amplifier having high-impedance inputs and feedback in accordance with a third embodiment.

FIG. 20 is a circuit diagram representing components of a buffer amplifier 10* having high-impedance inputs and feedback in accordance with a third embodiment. The buffer amplifier 10* depicted in FIG. 20 includes a pair of FETs 12a and 12b (e.g., GaN FETs) configured to provide differential outputs to a receiver and respective high-pass RC feedback circuits 3a and 3b designed to provide an input impedance that is a high impedance in the low-frequency extension band and matched to the antenna impedance in the high-frequency traditional band. Each RC feedback circuit 3a and 3b includes a resistor R and a capacitor C connected in series to realize a buffer that has high input impedance in the extension band and is matched to the antenna impedance in the traditional band.

Again, each FET has a gate G connected to a respective feed contact 38 of chip 16, a source S connected to a common ground node, and a drain D connected to a respective buffer amplifier output. The differential outputs are taken to the receiver or, optionally, a second amplification stage (not shown). More specifically, the RC feedback circuit 3a connects a junction J6 to a junction J7. Junction J6 is connected to gate G of FET 12a; junction J7 is connected to drain D of FET 12a. Similarly, the RC feedback circuit 3b connects a junction J8 to a junction J9. Junction J8 is connected to gate G of FET 12b; junction J9 is connected to drain D of FET 12b. The junctions J6 and J8 in turn are connected to respective feed contacts 38 on the chip 16. The output impedance of each FET 12a and 12b is preferably set to a system impedance which may be equal to 50 ohms in some embodiments. The resistor R may have a resistance of 50 ohms; the capacitor C may have a capacitance of 2 pF.

Figure 21:
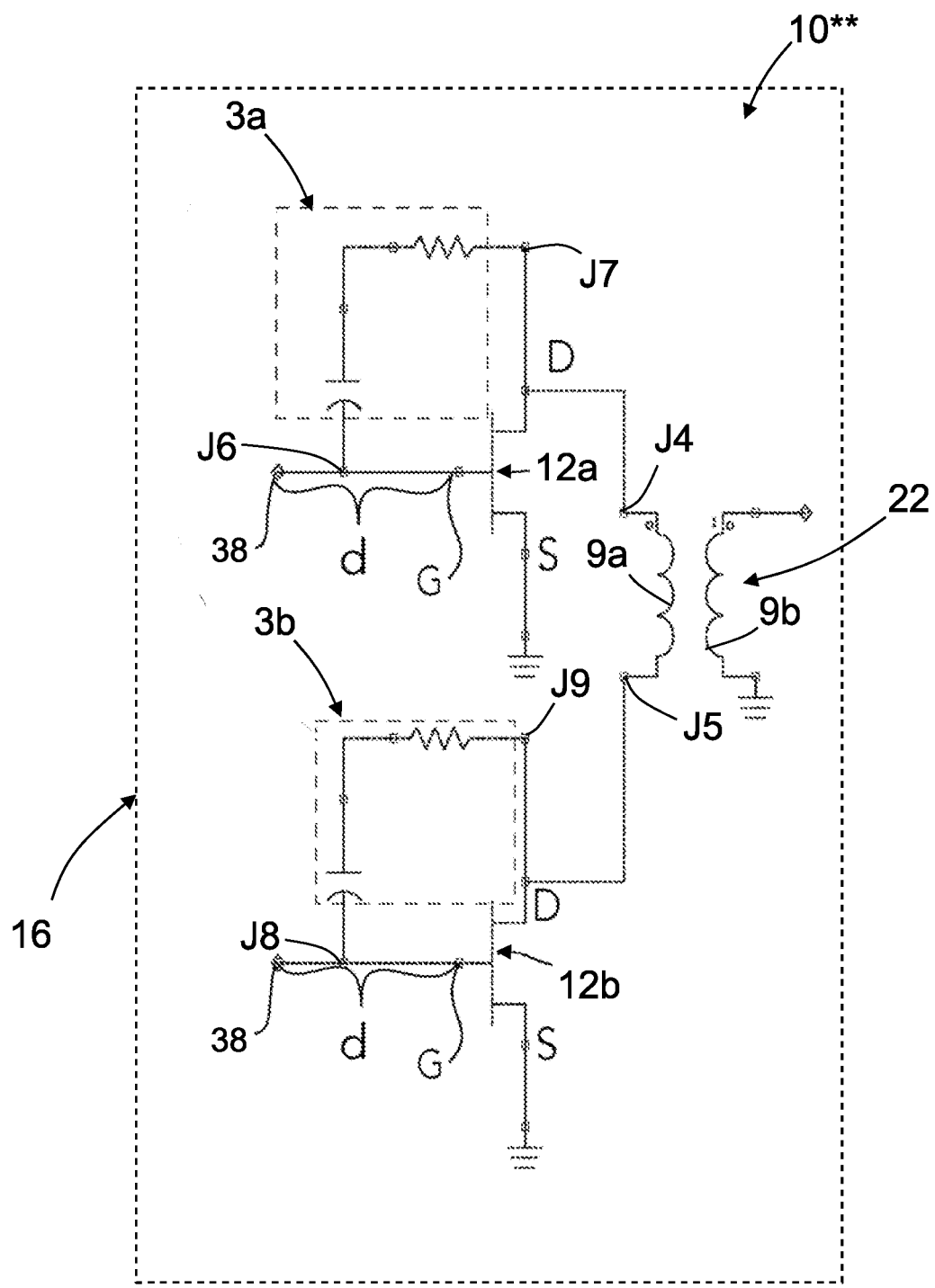
FIG. 21 is a circuit diagram representing components of a buffer amplifier having high-impedance inputs and feedback in accordance with a fourth embodiment.

FIG. 21 is a circuit diagram representing components of a buffer amplifier **10\*\* having high-impedance inputs and feedback in accordance with a fourth embodiment. The buffer amplifier 10\*\* depicted in FIG. 21 includes a pair of FETs 12a and 12b (e.g., GaN FETs) and respective high-pass RC feedback circuits 3a and 3b designed (as previously described with reference to FIG. 20) to provide an input impedance that is a high impedance in the low-frequency extension band and is matched to the antenna impedance in the high-frequency traditional band. The buffer amplifier 10\*\* further includes a transformer 22 configured (as previously described with reference to FIG. 19**) to provide a single-ended output to a receiver.

Figure 23:
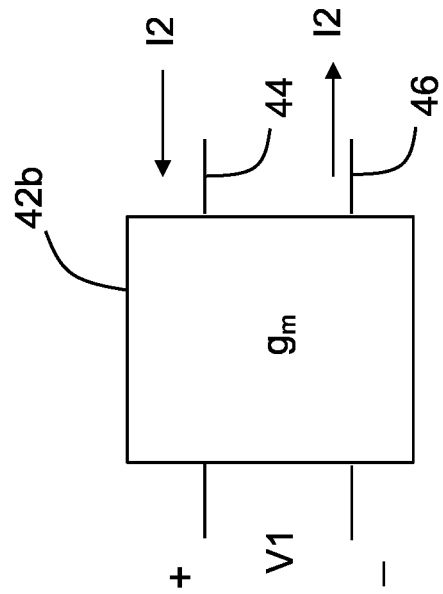
FIG. 23 is a diagram showing a differential embodiment of a transconductance stage Reference will hereinafter be made to the drawings in which similar elements in different drawings bear the same reference numerals.
Figure 22:
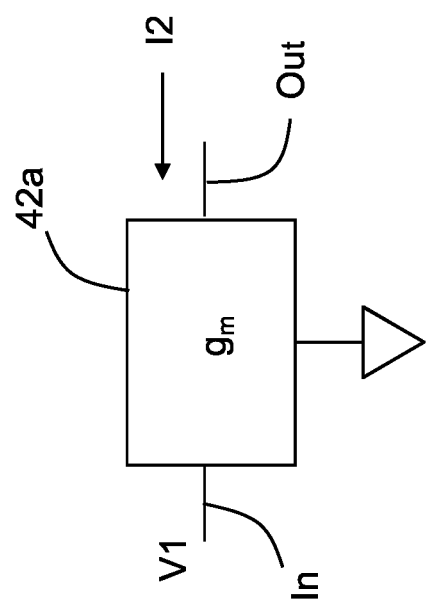
FIG. 22 is a diagram showing a single-ended embodiment of a transconductance stage.

One aspect common to all of the embodiments disclosed above is that each buffer amplifier comprises a transconductance stage coupled to In and Out terminals, wherein an output current 12 flowing into the transconductance stage is proportional to the input voltage V1 (from the antenna) times a gain factor $g_m$, commonly referred to as the transconductance. In buffer amplifiers, the output current 12 generates an output voltage when it is driven through a load impedance, commonly 50 Ohms. FIG. 22 is a diagram showing a single-ended embodiment of a transconductance stage 42a, wherein the input voltage V1 is referred to a ground potential. FIG. 23 is a diagram showing a differential embodiment of a transconductance stage 42b, comprising first output terminal 44 and a second output terminal 46, where the input voltage V1 and the output current 12 are taken differentially across the pair of terminals.

The transconductance stage preferably comprises one or more FETs. In alternative implementations, other types of transistors (e.g., bipolar transistors or similar vacuum devices) may be employed instead of FETs. In all of the embodiments described above, a skilled practitioner will recognize the need for, and be able to supply, appropriate DC bias currents and voltages to enable small signal analog operation. It is further understood that "coupled" can mean AC coupled through capacitance, electrically coupled, and can include small resistances up to approximately 100 Ohms.

In the first embodiment depicted in FIGS. 5 and 6, the transconductance stage comprises FET 12, wherein the gate G is coupled to the input and the drain D is coupled to the output, and the source S is grounded. In the second embodiment depicted in FIG. 7, the transconductance stage comprises FETs 12a and 12b in a cascode arrangement, wherein the input is coupled to the gate G of FET 12b and the output is coupled to the drain D of FET 12a, and the source S of FET 12b is grounded. In the third embodiment depicted in FIGS. 18-21, the transconductance stage comprises a differential pair of FETs 12a and 12b, wherein the differential input is coupled to the gates G of FETs 12a and 12b, the differential output is coupled to the drains D of FETs 12a and 12b, and the sources S are coupled to a common potential. In accordance with a fourth embodiment, which will be clear to a skilled practitioner based on the above description (although not depicted in the drawings), the transconductance stage comprises four FETs arranged as a differential pair of cascode transconductance stages, wherein a first differential input is coupled to the input of a first cascode stage, a second differential input is coupled to the input of a second cascode stage, a first differential output is coupled the output of the first cascode stage, a second differential output is coupled to the output of the second cascode stage, and the grounds of the first and second cascode stages are connected to a common potential.

The buffer amplifier is preferably designed such that above a RC cutoff frequency of the feedback network, the input impedance and the optimum noise impedance are both close to the antenna impedance. Another desirable feature is to design the RC cutoff frequency such that the feedback is minimized in the extension band, while maintaining amplifier stability and a relatively high input impedance compared to antenna impedance in the extension band.

While an active biconical antenna and a receive array comprising a combination of active biconical and Vivaldi antennas have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The invention claimed is:

1. An active biconical antenna comprising:
   upper and lower cones, each of the upper and lower cones comprising a respective truncated apex;
   first and second feed points respectively connected to the truncated apexes of the upper and lower cones;
   first and second conductors which are respectively connected to the first and second feed points; and
   a buffer amplifier comprising first and second input terminals which are respectively connected to the first and second conductors,
   wherein the buffer amplifier has an input impedance that is impedance matched to an antenna impedance at and above but not below a frequency $f_c$ and is higher than the antenna impedance at frequencies substantially less than $f_c$, and an output impedance that is impedance matched to a system impedance at frequencies both above and below $f_c$; and
   wherein a length of the first and second conductors is less than a wavelength at the frequency $f_c$.

2. The active biconical antenna as recited in claim 1, further comprising a ground plane that supports the lower cone.

3. The active biconical antenna as recited in claim 1, wherein the buffer amplifier comprises a transconductance stage.

4. The active biconical antenna as recited in claim 3, wherein the buffer amplifier further comprises an RC feedback network that is connected to the transconductance stage.

5. The active biconical antenna as recited in claim 4, wherein the RC feedback network comprises a plurality of RC feedback circuits.

6. The active biconical antenna as recited in claim 4, wherein the transconductance stage comprises a field-effect transistor having a gate connected to the first conductor, a source/ground connected to the second conductor, and a drain connected to an output.

7. The active biconical antenna as recited in claim 4, wherein:
   the transconductance stage comprises first and second field-effect transistors arranged in a cascode configuration;
   the first field-effect transistor comprises a first gate connected to the first conductor; and
   the second field-effect transistor comprises a second gate connected to a voltage source.

8. The active biconical antenna as recited in claim 3, wherein the transconductance stage comprises a differential pair of field-effect transistors having respective gates connected to the first and second conductors respectively.

9. The active biconical antenna as recited in claim 8, further comprising a transformer comprising first and second windings, wherein the first winding has one terminal connected to a drain of the first field-effect transistor and another terminal connected to a drain of the first field-effect transistor.

10. A direction finding system comprising:
    a biconical antenna;
    a first Vivaldi antenna;
    a receiver having a plurality of ports;
    a first buffer amplifier having inputs connected to the biconical antenna and having an output connected to a first port of the plurality of ports; and
    a second buffer amplifier having inputs connected to the first Vivaldi antenna and having an output connected to a second port of the plurality of ports.

11. The direction finding system as recited in claim 10, further comprising a first ground plane disposed between the biconical antenna and the first Vivaldi antenna, wherein the biconical antenna and first Vivaldi antenna are attached to opposite sides of the first ground plane.

12. The direction finding system as recited in claim 11, further comprising:
    a second Vivaldi antenna; and
    a third buffer amplifier having inputs connected to the second Vivaldi antenna and having an output connected to a third port of the plurality of ports.

13. The direction finding system as recited in claim 12, further comprising a second ground plane, wherein the first and second Vivaldi antennas are disposed between the first and second ground planes.

14. The direction finding system as recited in claim 11, wherein the first buffer amplifier comprises a field-effect transistor and an RC feedback circuit that connects a gate to a drain of the field-effect transistor.

15. The direction finding system as recited in claim 14, wherein the RC feedback circuit comprises:
    a resistor connected to a gate of the field-effect transistor, the resistor having a resistance that matches an input impedance of the first buffer amplifier to an impedance of the biconical antenna when the biconical antenna is receiving a signal having a frequency in a traditional band; and
    a capacitor connected to the resistor and to the drain of the field-effect transistor, the capacitor having a capacitance that prevents feedback in an extension band which extends from the traditional band to a frequency less than the lowest frequency of the traditional band.

16. The direction finding system as recited in claim 10, wherein the biconical antenna is configured to have:
    an input impedance that is impedance matched to an antenna impedance at and above but not below a frequency $f_c$ and that is higher than the antenna impedance at frequencies substantially less than $f_c$; and
    an output impedance that is impedance matched to a system impedance at frequencies both above and below $f_c$.

17. The direction finding system as recited in claim 16, further comprising first and second conductors which connect the biconical antenna to the first buffer amplifier, wherein:
    the biconical antenna comprises upper and lower cones, each of the upper and lower cones comprising a respective truncated apex and a feed point connected to the truncated apex;
    the first and second conductors are respectively connected to the feed points of the upper and lower cones; and
    the first buffer amplifier comprises first and second input terminals which are respectively connected to the first and second conductors, wherein a length of the first and second conductors is less than a wavelength at the frequency $f_c$.

18. An active conical antenna comprising:
    a cone comprising a truncated apex and a feed point connected to the truncated apex;
    a ground plane;
    first and second conductors which are respectively connected to the feed points and the ground plane; and
    a buffer amplifier comprising first and second input terminals which are respectively connected to the first and second conductors,
    wherein the buffer amplifier has an input impedance that is impedance matched to an antenna impedance at and above but not below a frequency $f_c$ and is higher than the antenna impedance at frequencies substantially less than $f_c$, and an output impedance that is impedance matched to a system impedance at frequencies both above and below $f_c$; and wherein a length of the first and second conductors is less than a wavelength at the frequency $f_c$.

19. The active conical antenna as recited in claim 18, wherein the buffer amplifier comprises a transconductance stage, the transconductance stage.

20. The active conical antenna as recited in claim 19, wherein transconductance stage further comprises a field effect transistor comprising a gate coupled to the first conductor.

\* \* \* \* \*